(12) United States Patent
Jee et al.

(10) Patent No.: US 9,274,374 B2
(45) Date of Patent: *Mar. 1, 2016

(54) DISPLAY DEVICE

(71) Applicant: Samsung Display Co. Ltd., Yongin, Gyeonggi-Do (KR)

(72) Inventors: Ahn-Ho Jee, Hwaseong-si (KR); Kun-Bin Lee, Suwon-si (KR); Dong-Hwan Kim, Suwon-si (KR); Hyeong-Cheol Ahn, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,949

(22) Filed: Jul. 1, 2014

(65) Prior Publication Data

US 2014/0313454 A1    Oct. 23, 2014

Related U.S. Application Data

(60) Continuation of application No. 12/578,947, filed on Oct. 14, 2009, now Pat. No. 8,786,795, which is a division of application No. 11/265,387, filed on Nov. 2, 2005, now Pat. No. 7,630,023.

(30) Foreign Application Priority Data

Nov. 23, 2004   (KR) .................. 10-2004-0096269
Mar. 31, 2005   (KR) .................. 10-2005-0027162

(51) Int. Cl.
*G02F 1/1335* (2006.01)
*G02F 1/1333* (2006.01)
(Continued)

(52) U.S. Cl.
CPC ...... *G02F 1/133608* (2013.01); *H01R 13/2442* (2013.01); *H01R 13/6471* (2013.01); *H01R 13/6585* (2013.01); *G02F 1/133308* (2013.01); *G02F 2001/133314* (2013.01); *H01R 13/6581* (2013.01)

(58) Field of Classification Search
CPC .............. G02F 1/133308; G02F 2001/133314; G02F 1/13452
USPC ..................... 349/58, 60, 149–152; 362/631
See application file for complete search history.

(56) References Cited

U.S. PATENT DOCUMENTS 5,373,101 A   12/1994   Barabolak
6,028,761 A    2/2000   Cooter
(Continued)

FOREIGN PATENT DOCUMENTS

CN   1383059 A   12/2002
JP   06265922 A    9/1994
(Continued)

*Primary Examiner* — Jessica M Merlin
(74) *Attorney, Agent, or Firm* — Cantor Colburn LLP

(57) ABSTRACT

A receiving container for a display device includes a bottom plate, a sidewall and a grounding unit. The sidewall is extended from the bottom plate to define a receiving space. The grounding unit is integrally formed with the bottom plate. The grounding unit includes a grounding member that grounds a circuit board received in the receiving space. The circuit board includes a grounding electrode and the grounding member corresponds to the grounding electrode. The grounding member is formed on a rear surface of the bottom plate. The grounding member may include a protrusion or a projected portion having an elastic structure.

10 Claims, 9 Drawing Sheets

(51) Int. Cl.
*H01R 13/24* (2006.01)
*H01R 13/6471* (2011.01)
*H01R 13/6585* (2011.01)
*H01R 13/6581* (2011.01)

(56) References Cited

U.S. PATENT DOCUMENTS

| | | | |
|---|---|---|---|
| 6,175,396 | B1 | 1/2001 | Kim et al. |
| 6,213,789 | B1 | 4/2001 | Chua et al. |
| 6,342,933 | B1 | 1/2002 | Nakamura et al. |
| 6,388,722 | B1 | 5/2002 | Yoshii et al. |
| 6,411,353 | B1 | 6/2002 | Yarita et al. |
| 6,504,586 | B1 | 1/2003 | Lee |
| 6,583,831 | B2 | 6/2003 | Kim |
| 7,602,467 | B2 | 10/2009 | Lee |
| 2001/0012087 | A1* | 8/2001 | Sasuga et al. ................ 349/149 |
| 2003/0043310 | A1 | 3/2003 | Cho |
| 2003/0169383 | A1 | 9/2003 | Kim |
| 2004/0114062 | A1 | 6/2004 | Nishio et al. |
| 2004/0179150 | A1 | 9/2004 | Lai |
| 2004/0179151 | A1* | 9/2004 | Lee ................................ 349/58 |
| 2004/0257515 | A1 | 12/2004 | Lee |
| 2005/0024573 | A1 | 2/2005 | Suzuki |
| 2005/0083447 | A1* | 4/2005 | Yu .................................. 349/58 |
| 2005/0110916 | A1 | 5/2005 | Park et al. |

FOREIGN PATENT DOCUMENTS

| | | |
|---|---|---|
| JP | 06347814 A | 12/1994 |
| JP | 10268272 A | 10/1998 |
| JP | 2003316282 | 11/2003 |
| JP | 2004258678 A | 9/2004 |
| JP | 2004264342 A | 9/2004 |
| KR | 1020040061119 A | 7/2001 |
| KR | 1020030056687 A | 7/2003 |
| KR | 1999075034 B1 | 9/2005 |
| TW | 507100 | 10/2002 |

* cited by examiner

DISPLAY DEVICE

CROSS REFERENCE TO RELATED APPLICATIONS

This application a continuation application of U.S. application Ser. No. 12/578,947 filed Oct. 14, 2009, which is a divisional application of U.S. application Ser. No. 11/265,387 filed Nov. 2, 2005 and issued as U.S. Pat. No. 7,630,023 on Dec. 8, 2009, which claims priority to Korean Patent Application No. 10-2004-0096269 filed on Nov. 23, 2004 and Korean Patent Application No. 10-2005-0027162 filed on Mar. 31, 2005, and all the benefits accruing therefrom under 35 U.S.C. §119, the contents of which are herein incorporated by reference in their entireties.

BACKGROUND OF THE INVENTION

1. Field of the Invention

The invention relates to a receiving container for a display device and a liquid crystal display device having the receiving container. More particularly, the invention relates to a receiving container for a display device capable of improving grounding characteristics and a liquid crystal display device having the receiving container.

2. Description of the Related Art

Generally, a liquid crystal display (LCD) device displays images using electrical and optical characteristics of liquid crystal installed therein. The LCD device has various advantages, for example, such as thin thickness, small volume and lightweight in comparison with a cathode ray tube (CRT). Thus, LCD devices have been widely used for portable computers, communication devices, television sets, and the like.

The LCD device includes a liquid crystal controlling unit that controls the liquid crystal, and a light providing unit that provides the liquid crystal with light. For example, the LCD device includes an LCD panel serving as the liquid crystal controlling unit and a backlight assembly serving as the light providing unit.

The LCD device further includes a driving unit that drives the LCD panel. The driving unit includes a flexible printed circuit (FPC). The FPC of the LCD device is grounded in order to protect driving circuits installed thereon from electro-static discharge (ESD) and electro-magnetic interference (EMI) generated in the LCD device.

The LCD device employs a conductive double-sided adhesive tape to ground the FPC through a bottom chassis receiving the backlight assembly. In detail, an insulation layer is formed between the FPC and the bottom chassis, and then the insulation layer is partially removed, so that the removed insulation layer is replaced with the conductive double-sided adhesive tape. Thus, the FPC and the bottom chassis are electrically connected to each other, so that the FPC is grounded.

Alternatively, a gap is formed between the bottom chassis receiving the backlight assembly and the FPC. The above-mentioned conductive double-sided adhesive tape is replaced with the gap. Thus, although the bottom chassis and the FPC do not make contact with each other, a spark is induced from a high voltage difference therebetween to generate a grounding path, so that the FPC is grounded.

However, a grounding method using the conductive double-sided adhesive tape has disadvantages in that manufacturing cost of the LCD device increases and manufacturing processes are complex. A grounding method using the gap has further disadvantages in that an FPC is irregular and unstable.

SUMMARY OF THE INVENTION

The invention provides a receiving container for a display device capable of improving grounding characteristics of a circuit board.

The invention also provides a display device capable of improving grounding characteristics of a circuit board.

The invention also provides an LCD device capable of improving grounding characteristics of a circuit board.

In an exemplary embodiment, a receiving container for a display device includes a bottom plate, a sidewall and a grounding unit. The sidewall is extended from the bottom plate to define a receiving space. The grounding unit is integrally formed with the bottom plate.

In another exemplary embodiment, a display device includes a display panel, a circuit board and a receiving container. The display panel displays an image. The circuit board provides the display panel with a driving signal. The receiving container receives the display panel. The receiving container includes a bottom plate, sidewalls extended from the bottom plate to define a receiving space and a grounding unit integrally formed with the bottom plate.

In another exemplary embodiment, a display device includes a display panel, a receiving container and a circuit board. The display panel displays an image. The receiving container receives the display panel. The receiving container includes a bottom plate and sidewalls extended from the bottom plate to define a receiving space. The circuit board provides the display panel with a driving signal. The circuit board includes a base substrate and a grounding member integrally formed with the base substrate. The grounding member is protruded from the base substrate to make contact with the bottom plate.

In another exemplary embodiment, an LCD device includes a backlight assembly, an LCD panel, an FPC and a receiving container. The backlight unit provides light. The LCD panel displays an image using the light. The FPC provides the LCD panel with a driving signal. The receiving container receives the LCD panel. The receiving container includes a bottom plate, sidewalls extended from the bottom plate to define a receiving space and a grounding unit integrally formed with the bottom plate.

In another exemplary embodiment, an LCD device includes a backlight assembly, an LCD panel, a receiving container and a circuit board. The backlight unit provides light. The LCD panel displays an image using the light. The receiving container receives the LCD panel. The receiving container includes a bottom plate and sidewalls extended from the bottom plate to define a receiving space. The circuit board provides the LCD panel with a driving signal. The circuit board includes a base substrate and a grounding member integrally formed with the base substrate. The grounding member is protruded from the base substrate to make contact with the bottom plate.

Advantageously, manufacturing cost of the LCD device may be reduced and a grounding structure may be simplified. The FPC of the LCD device may be regularly and stably grounded, such that grounding characteristics may be improved. An ESD and an EMI generated from an FPC may be rapidly removed through the grounding structure.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE INVENTION

Figure 1:
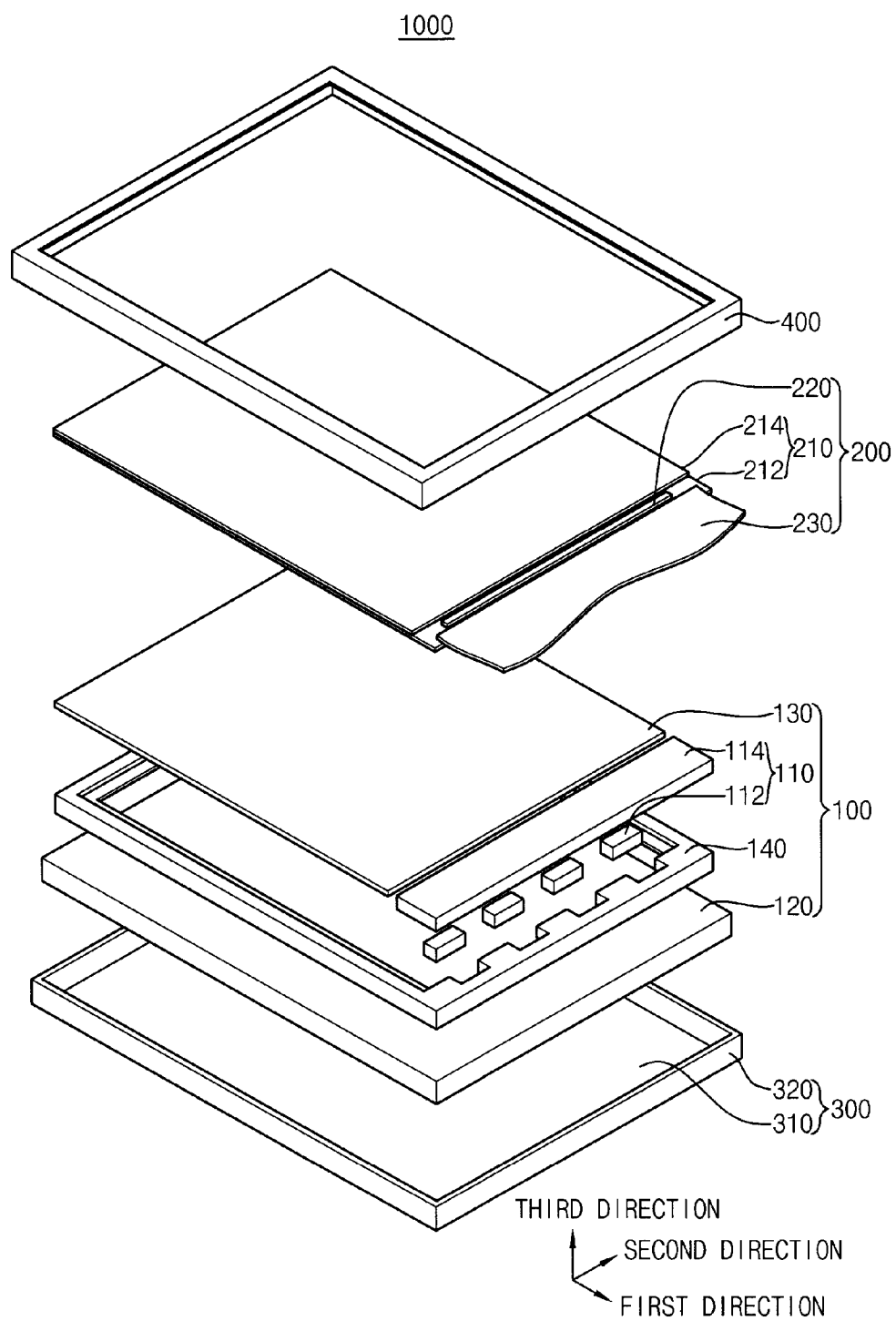
FIG. 1 is an exploded perspective view illustrating an exemplary embodiment of an LCD device according to the present invention.

Exemplary embodiments will be described more fully hereinafter with reference to the accompanying drawings, in which embodiments of the invention are shown. The invention may, however, be embodied in many different forms and should not be construed as limited to the embodiments set forth herein; rather, these embodiments are provided so that this disclosure will be thorough and complete, and will fully convey the scope of the invention to those skilled in the art. Like reference numerals refer to similar or identical elements throughout.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the illustrated embodiments. Spatially relative terms, such as "lower", "upper", "rear" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" other elements or features would then be oriented "above" other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 2:
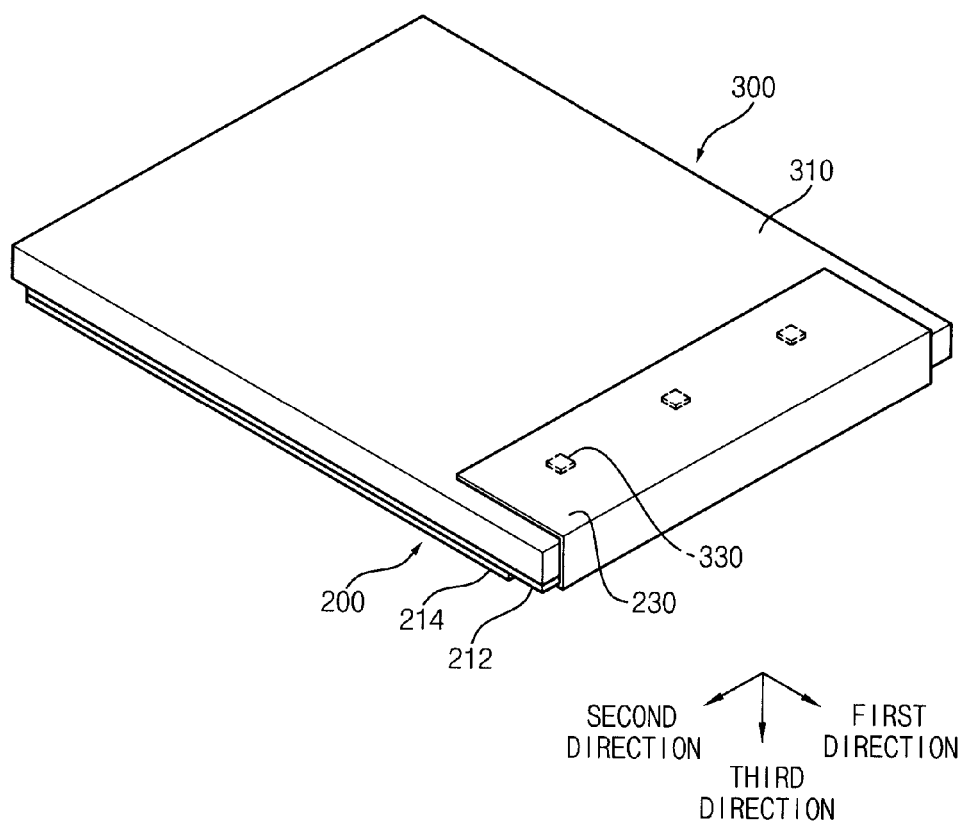
FIG. 2 is an upside-down perspective view illustrating the LCD device in FIG. 1.

FIG. 1 is an exploded perspective view illustrating an exemplary embodiment of an LCD device according to the invention. FIG. 2 is an upside-down perspective view illustrating the LCD device in FIG. 1.

Referring to FIG. 1, an LCD device 1000 includes a backlight unit 100, a display unit 200, a receiving container 300 and a chassis 400.

The backlight unit 100 generates light to provide the display unit 200 with the light. The backlight unit 100 includes a light-generating part 110, a light guiding plate 120, an optical member 130 and a mold frame 140.

The light-generating part 110 includes a plurality of light emitting diodes (LEDs) 112 and a printed circuit board (PCB) 114. The PCB 114 is disposed on the LEDs 112 and configured to apply a voltage for generating the light to the LEDs 112.

The light guiding plate 120 guides light generated from the light-generating part 110 toward the optical member 130. The light guiding plate 120 converts light generated from the LEDs 112 having a point type distribution into light that has a surface type distribution.

In exemplary embodiments, the light guiding plate 120 may have a substantially flat plate shape such that the light guiding plate 120 has a uniform thickness. A thickness of the light guiding plate 120 is substantially identical from one end portion thereof adjacent to the LEDs 112 to another end portion thereof substantially opposite to the one end portion.

In alternative embodiments, the light guiding plate 120 may have a wedge shape. A thickness of the light guiding plate 120 may gradually decreased from one end portion thereof to another end portion substantially opposite to the one end portion thereof.

The light emitted from the light guiding plate 120 has somewhat low luminance uniformity. When the backlight unit 100 includes the light guiding plate 120, the backlight unit 100 may not provide sufficient light for displaying an image of high quality. To address this disadvantage, the backlight unit 100 may include the optical member 130. The optical member may include, but is not limited to, a light-diffusing sheet, a prism sheet and a dual brightness enhancement film (DBEF). Advantageously, the light-diffusing sheet may enhance the luminance uniformity of the light emitted from the light guiding plate 120, and the prism sheet may improve a viewing angle of displayed images. In addition, the DBEF may increase the luminance and a viewing angle of the displayed images.

Referring to FIG. 1, the mold frame 140 may have a substantially frame shape. The mold frame 140 receives and supports the optical member 130 disposed thereon. The mold frame 140 also receives and supports the light guiding plate 120 placed in a lower portion thereof. The PCB 114 is disposed on a side portion of the mold frame 140. The LEDs 112 are disposed in a plurality of grooves formed at the side portion of the mold frame 140.

In exemplary embodiments, the back light unit 100 may include a light-reflecting sheet (not shown). The light-reflecting sheet is disposed under the light guiding plate 120. The light-reflecting sheet reflects light leaked from the light guiding plate 120 toward the light guiding plate 120.

Referring again to FIG. 1, the display unit 200 displays images using light generated from the backlight unit 100. The display unit 200 includes a LCD panel 210, a driver chip 220 and an FPC 230.

The LCD panel 210 includes a thin film transistor (TFT) substrate 212, a color filter substrate 214 and a liquid crystal layer (not shown) interposed between the TFT substrate 212 and the color filter substrate 214.

The TFT substrate 212 may include a pixel electrode (not shown) arranged in a matrix shape, a TFT (not shown) applying a driving voltage to the pixel electrode, a gate line (not shown) and a data line (not shown).

The color filter substrate 214 may include a color filter (not shown) facing the pixel electrode formed on the TFT substrate 212 and a common electrode (not shown) formed on the color filter.

The FPC 230 provides a driving signal for driving the LCD panel 210. The driver chip 220 is disposed on the TFT substrate 212 to control timing for applying the driving signal provided from the FPC 230 to the LCD panel 210. For example, the driver chip 220 may include chip on glass (COG), whereby the driver chip 220 may be directly formed on the LCD panel 210.

Referring to FIG. 2, the FPC 230 is flexible, such that the FPC is bent toward a rear surface of the receiving container 300 to be installed thereon. The first, second and third directions shown in FIGS. 1 and 2 indicate a direction substantially parallel with a major axis of the LCD panel 210, a direction substantially parallel with a minor axis of the LCD panel 210, and a light-advancing direction from the backlight unit 100 to the LCD panel 210, respectively.

Now referring to FIG. 1, the receiving container 300 receives the backlight unit 100 and the display unit 200, successively. The receiving container 300 includes a bottom plate 310 and a plurality of sidewalls 320. The sidewalls 320 may be integrally formed with the bottom plate 310 and extend in the third direction from the bottom plate 310 to define a receiving space. A grounding member 330 is integrally formed with a rear surface of the bottom plate 310 of the receiving container 300 to ground the FPC 230 to the receiving container 300.

The chassis 400 surrounds an edge portion of the LCD panel 210. The chassis 400 is combined with the receiving container 300. The chassis 400 essentially protects the LCD panel 210, and prevents shifting of the LCD panel 210.

Hereinafter, a grounding structure of the FPC 230 will be described more fully with reference to the accompanying drawings. In the illustrated embodiment, the grounding structure of the FPC 230 that drives the LCD panel 210 will be described. However, in alternative embodiments, various circuit boards of the LCD device 1000 may employ the grounding structure.

Figure 3:
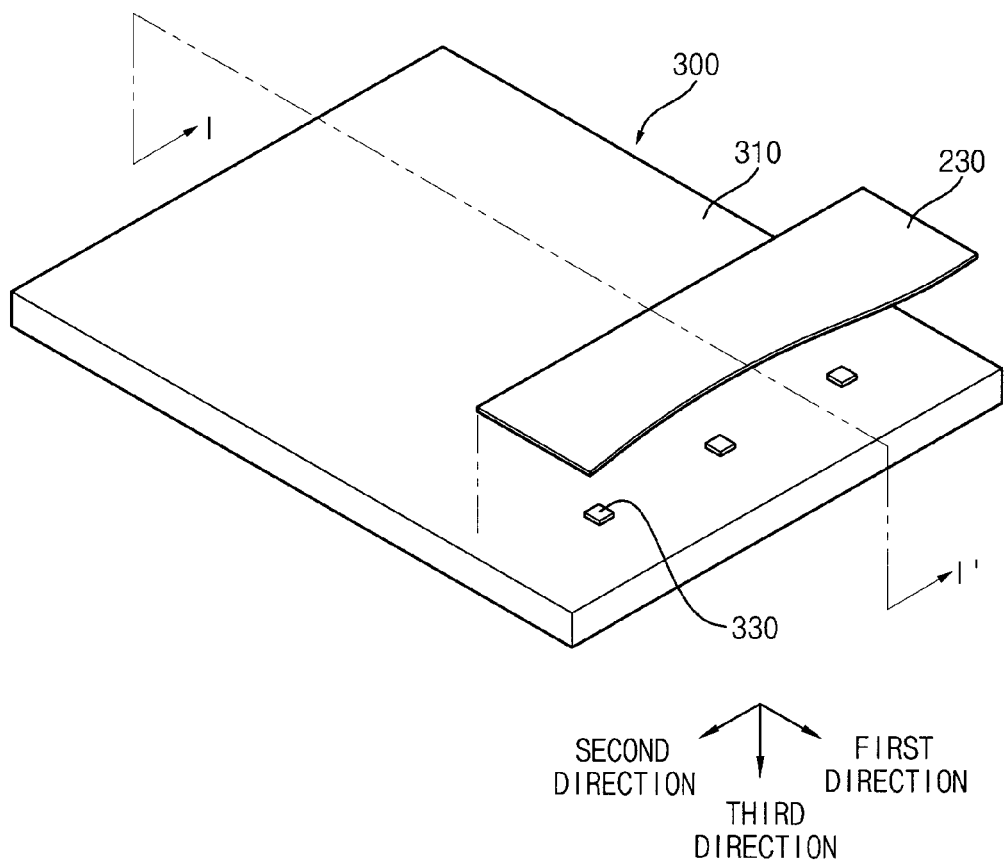
FIG. 3 is an exploded perspective view illustrating an exemplary embodiment of an FPC and a receiving container in FIG. 2.
Figure 4:
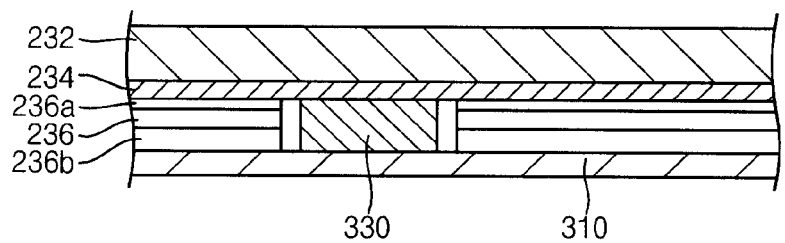
FIG. 4 is a cross-sectional view taken along line I-I' in FIG. 3.

FIG. 3 is an exploded perspective view illustrating an exemplary embodiment of an FPC and a receiving container in FIG. 2. FIG. 4 is a cross-sectional view taken along line I-I' in FIG. 3.

Referring to FIGS. 3 and 4, the FPC 230 is placed on the rear surface of the receiving container 300. The FPC 230 is flexible, so that the FPC 230 may be bent toward the rear surface of the receiving container 300 to be installed thereon.

The FPC 230 includes a base substrate 232 and at least one grounding electrode 234 formed on the base substrate 232. In the illustrated embodiment, the FPC 230 has three grounding electrodes 234. In alternative embodiments, a number of the grounding electrodes 234 may be more or less than three. For example, the FPC 230 may have one grounding electrode 234 disposed substantially in the second direction of the FPC 230.

The grounding electrode 234 makes contact with the grounding member 330 protruded from the bottom plate 310 of the receiving container 300. The grounding member 330 corresponds to the grounding electrode 234. In the illustrated embodiment, the grounding member 330 has a substantially rectangular plate shape. A stepped portion is formed between the bottom plate 310 and the grounding member 330. The grounding member 330 makes contact with the grounding electrode 234.

The FPC 230 further includes an insulation layer 236 electrically insulating the FPC 230 from the receiving container 300. The insulation layer 236 is formed on the base substrate 232 to prevent various circuit patterns formed on the base substrate 232 from being electrically connected to the bottom plate 310 of the receiving container 300. An opening corresponding to the grounding member 330 is formed through the insulation layer 236. A portion of the insulation layer 236 at which the grounding electrode 234 is placed is open, such that the grounding electrode 234 and the grounding member 330 corresponding thereto may be electrically connected to each other. For example, the opening of the insulation layer 236 may be formed on the FPC 230 corresponding to a peripheral portion of the bottom plate 310, and the grounding member 330 is placed at the peripheral portion of the bottom plate 310. In alternative embodiments, various positions of the opening and the grounding member 330 are contemplated.

The insulation layer 236 is combined with the base substrate 232 of the FPC 230 through a first adhesive member 236a, and combined with the bottom plate 310 of the receiving container 300 through a second adhesive member 236b. The first and second adhesive members 236a and 236b may include a gluing agent or a double-sided adhesive tape. In exemplary embodiments, the first and second adhesive members 236a and 236b may be the same or different types of material. For example, in the illustrated embodiment, the first and second adhesive members 236a and 236b of FIG. 4 are a gluing agent and a double-sided adhesive tape, respectively.

In another exemplary embodiment, the grounding member 330 and the receiving container 300 may include a conductive material such as metal. Advantageously, an ESD and an EMI generated from the FPC 230 may be rapidly removed to the receiving container 300 through the grounding member 330.

In alternative embodiments, the grounding member 330 may include a conductive elastic material such as conductive rubber, such that the grounding member 330 may make contact with the grounding electrode 234 more firmly.

Figure 5:
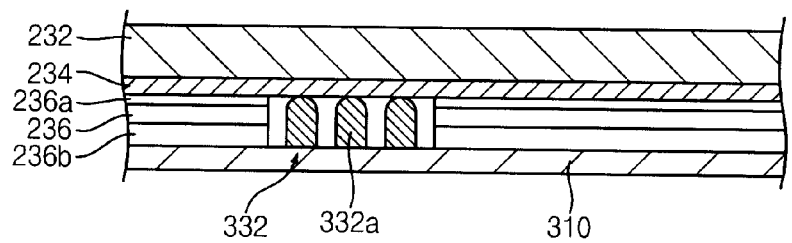
FIG. 5 is a cross-sectional view illustrating another exemplary embodiment of an FPC and a receiving container of an LCD device according to the present invention.

FIG. 5 is a cross-sectional view illustrating another exemplary embodiment of an FPC and a receiving container of an LCD device according to the invention. The LCD device the illustrated embodiment is substantially identical to the LCD device of FIGS. 1-4 except for a grounding member. Thus, any further description for the substantially same elements will be omitted.

Referring to FIG. 5, a grounding member 332 includes at least one protrusion 332a. In the illustrated embodiment, a plurality of protrusions 332a is protruded from the bottom plate 310 of the receiving container 300. The protrusions 332a are protruded toward the FPC 230 to make contact with the grounding electrode 234 formed on the FPC 230.

The grounding member 332 corresponds to the grounding electrode 234, and the protrusions 332a make contact with the grounding electrode 234. For example, the grounding member 332 is placed at a peripheral portion of the bottom plate 310. In alternative embodiments, various positions of the grounding member 332 are contemplated.

In exemplary embodiments, the grounding member 332 and the receiving container 300 may include a conductive material such as metal. Advantageously, an ESD and an EMI generated from the FPC 230 may be rapidly removed to the receiving container 300 through the grounding member 332.

In alternative embodiments, the grounding member 332 may include a conductive elastic material such as conductive rubber, such that the grounding member 332 may make contact with the grounding electrode 234 more firmly.

Figure 6:
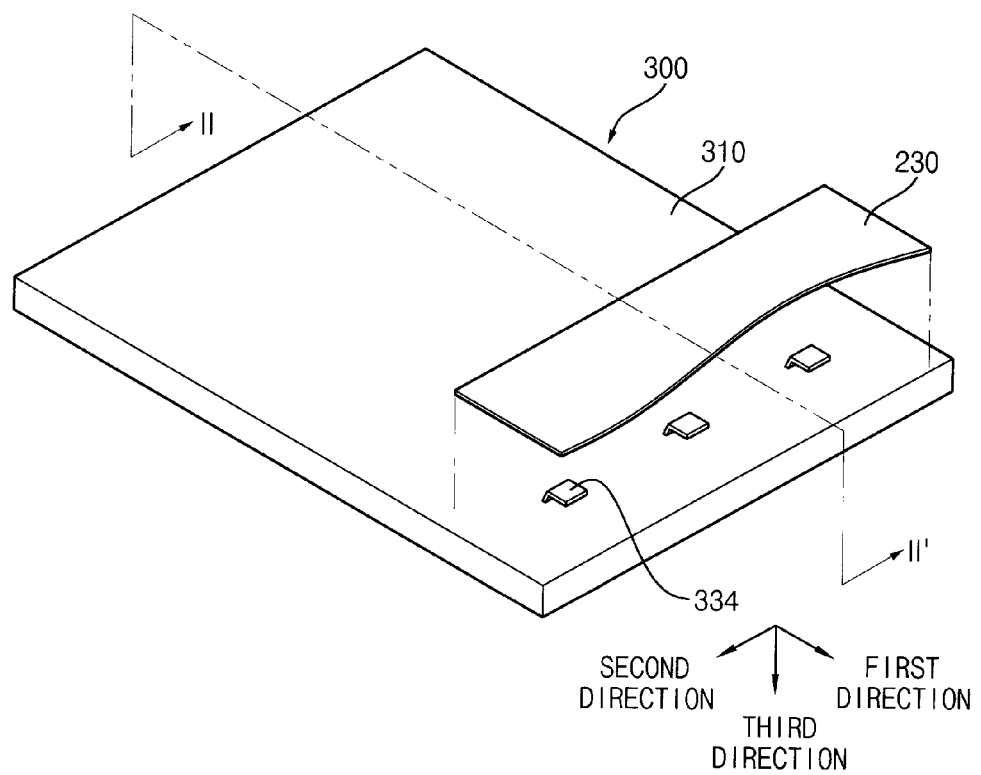
FIG. 6 is an exploded perspective view illustrating another exemplary embodiment of an FPC and a receiving container of an LCD device according to the present invention.
Figure 7A:
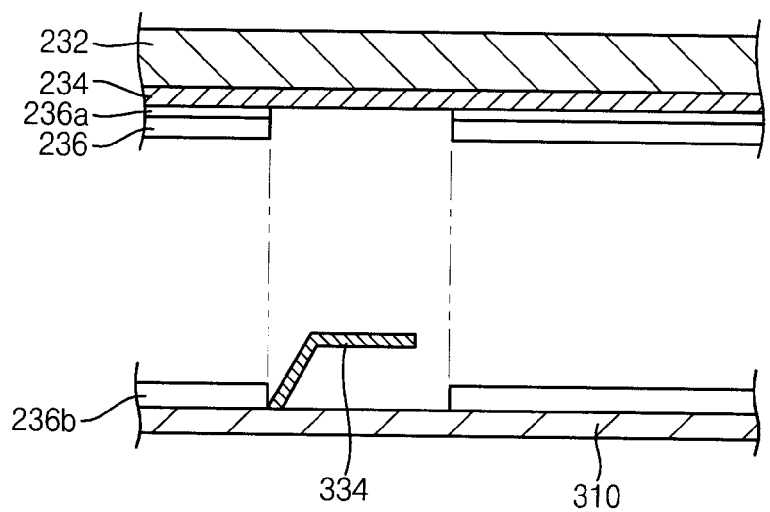
FIGS. 7A and 7B are cross-sectional views taken along line II-II' in FIG. 6.
Figure 7B:
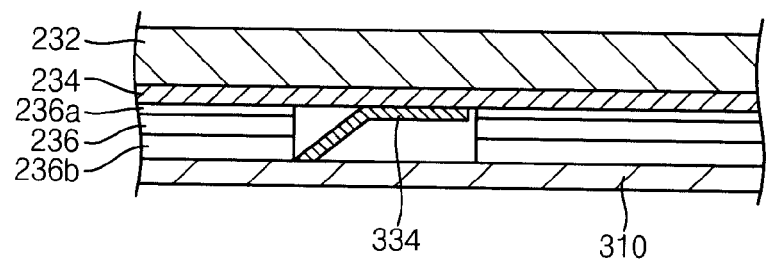

FIG. 6 is an exploded perspective view illustrating an exemplary embodiment of an FPC and a receiving container of an LCD device according to the invention. FIGS. 7A and 7B are cross-sectional views taken along line II-II' in FIG. 6. FIGS. 7A and 7B illustrate the FPC and the receiving container of the LCD device before and after the FPC is disposed on the receiving container, respectively. The LCD device of the illustrated embodiment is substantially identical to the LCD device of FIGS. 1-4 except for a grounding member. Thus, any further description for the substantially same elements will be omitted.

Referring to FIGS. 6 and 7B, the FPC 230 has three grounding electrodes 234 in the illustrated embodiment. In alternative embodiments, a number of the grounding electrodes 234 may be more or less than three. For example, the grounding electrode 234 may have one grounding electrode 234 extended substantially toward the second direction. The grounding electrode 234 makes contact with a grounding member 334 protruded from the bottom plate 310 of the receiving container 300. The grounding member 334 corresponds to the grounding electrode 234.

In the illustrated embodiment, one end portion of the grounding member 334 makes contact with the bottom plate 310, and another end portion of the grounding member 334 is spaced apart from the bottom plate 310. The end portion spaced apart from the bottom plate 310 may include a contact portion having a substantially rectangular plate shape to make contact with the grounding electrode 234, as shown in FIG. 6. In the illustrated embodiment, the grounding member 334 may be disposed on a peripheral portion of the bottom plate 310 of the receiving container 300. However, various positions of the grounding member 334 are also contemplated.

Referring to FIGS. 7A and 7B, the grounding member 334 corresponds to a projected portion formed on the bottom plate 310 of the receiving container 300. The grounding member 334 includes an extension portion extended toward the FPC 230 and a contact portion making contact with the grounding electrode 234. The extension portion is extended obliquely toward the FPC 230, and the contact portion is extended substantially parallel with the FPC 230.

Before the FPC 230 is placed on the bottom plate 310 of the receiving container 300, the grounding member 334 has a first height larger than a second height corresponding to a total thickness of the first adhesive member 236a, the insulation layer 236 and the second adhesive member 236b. However, after the FPC 230 is placed on the bottom plate 310 of the receiving container 300, the grounding member 334 has a third height substantially same as the second height. In exemplary embodiments, the grounding member 334 essentially supports the FPC 230 because the grounding member 334 may have an elastic structure. Advantageously, the grounding member 334 may make contact with the grounding electrode 234 more firmly.

In the illustrated embodiment, the grounding member 334 is extended from a central portion toward a peripheral portion of a rear surface of the bottom plate 310 as shown in FIGS. 6 to 7B. Alternatively, the grounding member 334 may be extended from the peripheral portion toward the central portion of the rear surface of the bottom plate 310.

In exemplary embodiments, the grounding member 334 and the receiving container 300 may include a conductive material such as metal. Advantageously, an ESD and an EMI generated from the FPC 230 may be rapidly removed to the receiving container 300 through the grounding member 334.

In alternative embodiments, the grounding member 334 may include a conductive elastic material such as conductive rubber, such that the grounding member 334 may make contact with the grounding electrode 234 more firmly.

Figure 8:
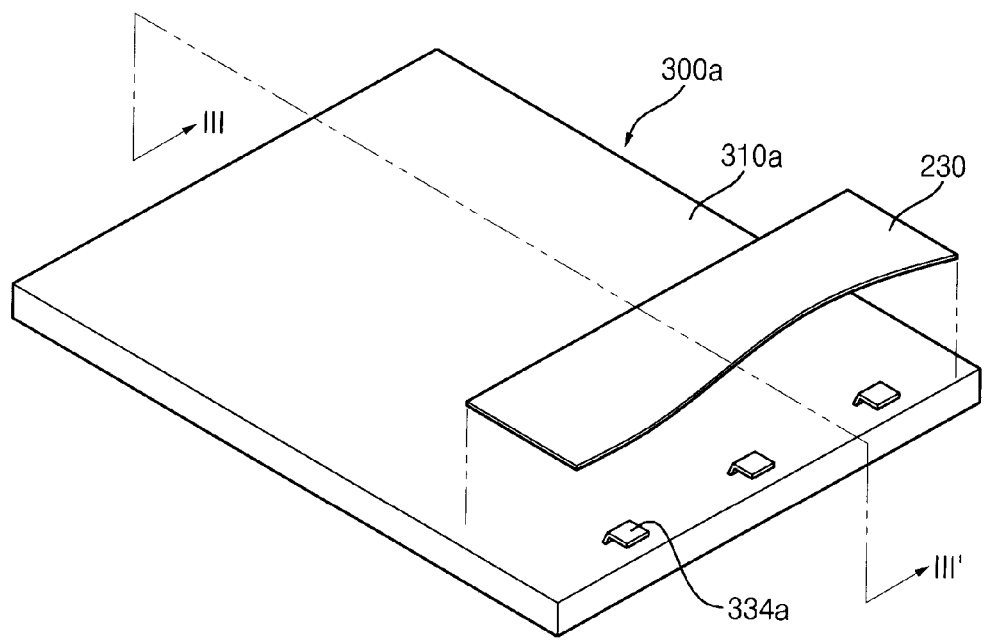
FIG. 8 is an exploded perspective view illustrating another exemplary embodiment of an FPC and a receiving container of an LCD device according to the present invention.
Figure 8:
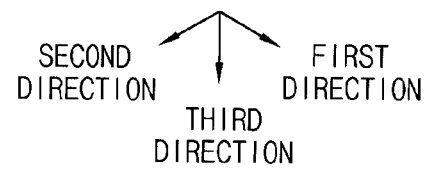
Figure 9:
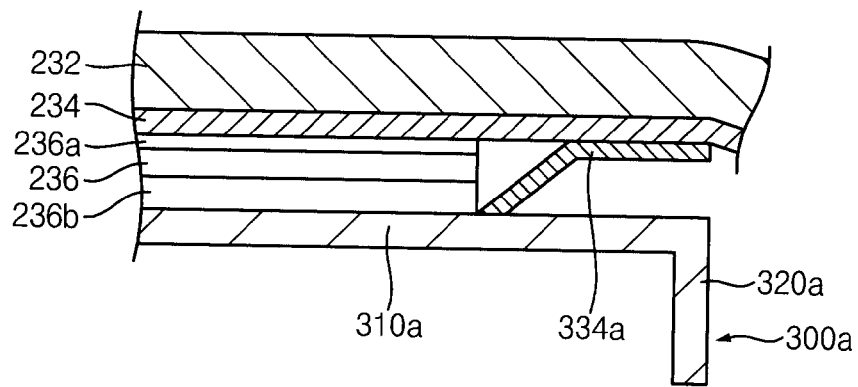
FIG. 9 is a cross-sectional view taken along line III-III' in FIG. 8.

FIG. 8 is an exploded perspective view illustrating another exemplary embodiment of an FPC and a receiving container of an LCD device according to the invention. FIG. 9 is a cross-sectional view taken along line III-III' in FIG. 8. The LCD device of the illustrated embodiment is substantially identical to the LCD device of FIGS. 6, 7A and 7B except for an insulation layer and a receiving container. Thus, any further description for the substantially same elements will be omitted.

Figure 10:
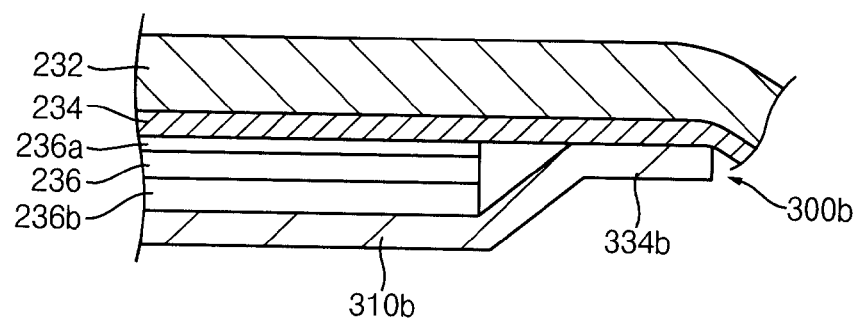
FIG. 10 is a cross-sectional view illustrating another exemplary embodiment of an FPC and a receiving container of an LCD device according to the present invention.

Referring to FIGS. 8 and 9, a receiving container 300a includes a bottom plate 310a and a plurality of sidewalls 320a. The sidewalls 320a may be integrally formed with the bottom plate 310a and extend in the third direction from the bottom plate 310a to define a receiving space. The insulation layer 236 is formed on the base substrate 232 to prevent various circuit patterns formed on the base substrate 232 from being electrically connected to the bottom plate 310a of the receiving container 300a. In exemplary embodiments, an opening corresponding to a grounding member 334a may be formed through the insulation layer 236. A portion of the insulation layer 236 at which the grounding electrode 234 is placed is open, such that the grounding electrode 234 and the grounding member 334a corresponding thereto may be electrically connected to each other. In alternative embodiments, the opening of the insulation layer 236 may be formed on the FPC 230 adjacent to a bent portion thereof. The grounding member 334a is placed at an end portion of the bottom plate 310a proximate the bent portion of the FPC 230, as shown in FIGS. 9 and 10. Advantageously, an opening process of the insulation layer 236 is not required, such that a manufacturing process of an LCD device 1000 may be simplified.

The insulation layer 236 is combined with the base substrate 232 of the FPC 230 through the first adhesive member 236a, and combined with the bottom plate 310a of the receiving container 300a through the second adhesive member 236b. The first and second adhesive members 236a and 236b may include a gluing agent or a double-sided adhesive tape. In exemplary embodiments, the first and second adhesive members 236a and 236b may be the same or different types of material. For example, in the illustrated embodiment, the first and second adhesive members 236a and 236b of FIG. 9 are a gluing agent and a double-sided adhesive tape, respectively.

In the illustrated embodiment, the grounding member 334a is extended from a central portion toward a peripheral portion of a rear surface of the bottom plate 310a as shown in FIG. 9. Alternatively, the grounding member 334a may be extended from the peripheral portion toward the central portion of the rear surface of the bottom plate 310a.

In exemplary embodiments, the grounding member 334a and the receiving container 300a include a conductive material such as metal. Advantageously, an ESD and an EMI generated from the FPC 230 may be rapidly removed to the receiving container 300a through the grounding member 334a.

In alternative embodiments, the grounding member 334a may include a conductive elastic material such as conductive rubber, such that the grounding member 334a may make contact with the grounding electrode 234 more firmly.

FIG. 10 is a cross-sectional view illustrating another exemplary embodiment of an FPC and a receiving container of an LCD device according to the invention. The LCD device of the illustrated embodiment is substantially identical to the LCD device of FIGS. 8 and 9 except for a receiving container and a grounding member. Thus, any further description for the substantially same elements will be omitted.

Referring to FIG. 10, a grounding member 334b is extended from an end portion of a bottom plate 310b of a receiving container 300b, and integrally formed with the bottom plate 310b, such that the grounding member 334b constitutes a part of the receiving container 300b. Advantageously, a forming process of a separate grounding member 334b may be omitted, such that a manufacturing process of an LCD device may be simplified.

The receiving container 300b may have a pair of sidewalls (not shown) protruded from the bottom plate 310b, and the grounding member 334b is formed at an end portion of the bottom plate 310b between the sidewalls. The receiving container 300b may not include a sidewall corresponding to a bent portion of the FPC 230. The grounding member 334b may be extended substantially in a third direction shown in FIG. 10 to form a sidewall of the receiving container 300b. In alternative embodiments, the receiving container 300b may include more than two sidewalls.

In exemplary embodiments, the grounding member 334b and the receiving container 300b include a conductive material such as metal. Advantageously, an ESD and an EMI generated from the FPC 230 may be rapidly removed to the receiving container 300b through the grounding member 334b.

In alternative embodiments, the grounding member 334b may include a conductive elastic material such as conductive rubber, so that the grounding member 334b may make contact with the grounding electrode 234 more firmly.

Figure 11A:
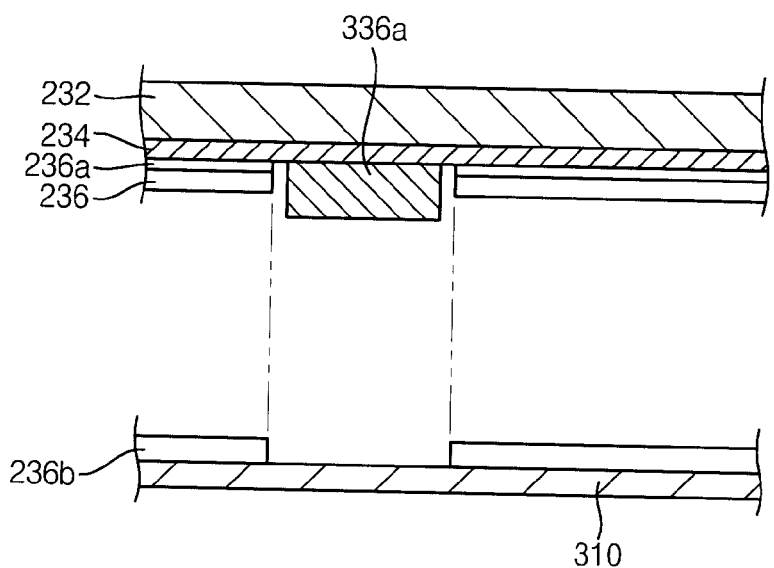
FIGS. 11A and 11B are cross-sectional views illustrating another exemplary embodiment of an FPC and a receiving container of an LCD device according to the present invention.
Figure 11B:
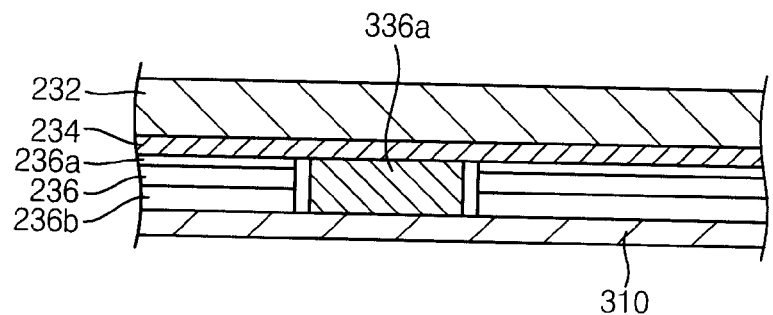

FIGS. 11A and 11B are cross-sectional views illustrating another exemplary embodiment of an FPC and a receiving container of an LCD device according to the invention. FIGS. 11A and 11B illustrate the FPC and the receiving container of the LCD device before and after the FPC is disposed on the receiving container, respectively. The LCD device of the illustrated embodiment is substantially identical to the LCD device of FIGS. 1-4 except for a grounding member. Thus, any further description for the substantially same elements will be omitted.

Referring to FIGS. 11A and 11B, a grounding member 336a is integrally formed with the base substrate 232, and protruded from the base substrate 232 to make contact with the bottom plate 310 of the receiving container 300. The grounding member 336a is electrically connected to the grounding electrode 234. In the illustrated embodiment, the grounding member 336a has a rectangular plate shape, and a stepped portion is formed between the base substrate 232 of the FPC 230 and the grounding member 336a. The grounding member 336a makes contact with the bottom plate 310 of the receiving container 300.

The FPC 230 further includes an insulation layer 236 electrically insulating the FPC 230 from the receiving container 300. The insulation layer 236 is formed on the base substrate 232 to prevent various circuit patterns formed on the base substrate 232 from being electrically connected to the bottom plate 310 of the receiving container 300. An opening is formed through the insulation layer 236 such that the grounding member 336a is disposed thereat. A portion of the insulation layer 236 at which the grounding electrode 234 is placed is open, so that the grounding electrode 234 and the receiving container 300 may be electrically connected to each other through the grounding member 336a.

The opening of the insulation layer 236 is formed on the FPC 230 corresponding to a peripheral portion of the bottom plate 310, and the grounding member 336a is placed at the opening. However, various positions of the opening and the grounding member 336a are contemplated.

The insulation layer 236 is combined with the base substrate 232 of the FPC 230 through the first adhesive member 236a, and combined with the bottom plate 310 of the receiving container 300 through the second adhesive member 236b. The first and second adhesive members 236a and 236b may include a gluing agent or a double-sided adhesive tape. In exemplary embodiments, the first and second adhesive members 236a and 236b may be the same or different types of material. For example, in the illustrated embodiment, the first and second adhesive members 236a and 236b of FIGS. 11A and 11B are a gluing agent and a double-sided adhesive tape, respectively.

In exemplary embodiments the grounding member 336a and the receiving container 300 include a conductive material such as metal. Advantageously, an ESD and an EMI generated from the FPC 230 may be rapidly removed to the receiving container 300 through the grounding member 336a.

In alternative embodiments, the grounding member 336a may include a conductive elastic material such as conductive rubber, such that the grounding member 336a may make contact with the grounding electrode 234 more firmly.

A grounding structure of the FPC 230 according to the illustrated embodiment is employed for electrically connecting the FPC 230 to the receiving container 300. The grounding structure of the FPC 230 may also be employed for electrically connecting an FPC 230 to another FPC 230. Alternatively, the grounding structure of the FPC 230 may be employed for electrically connecting an FPC 230 to a PCB.

Figure 12A:
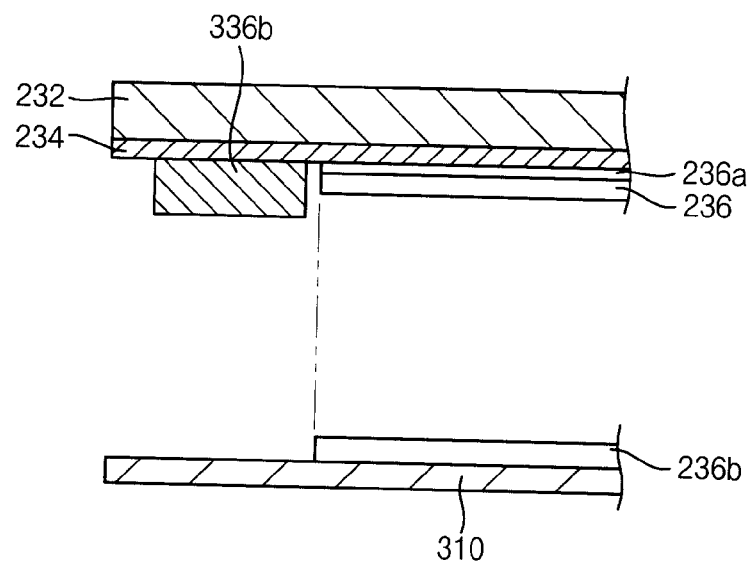
FIGS. 12A and 12B are cross-sectional views illustrating another exemplary embodiment of an FPC and a receiving container of an LCD device according to the present invention.
Figure 12B:
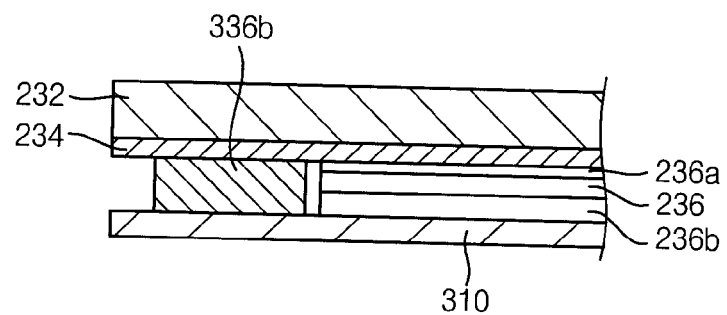

FIGS. 12A and 12B are cross-sectional views illustrating another exemplary embodiment of an FPC and a receiving container of an LCD device according to the invention. FIGS. 12A and 12B illustrate the FPC and the receiving container of the LCD device before and after the FPC is disposed on the receiving container, respectively. The LCD device of the illustrated embodiment is substantially identical to the LCD device of FIGS. 11A and 11B 6 except for a grounding member. Thus, any further description for the substantially same elements will be omitted.

Referring to FIGS. 12A and 12B, the insulation layer 236 is formed on the base substrate 232 to prevent various circuit patterns formed on the base substrate 232 from being electrically connected to a bottom plate 310 of a receiving container 300. An opening is formed through the insulation layer 236 such that a grounding member 336*b* may be disposed thereat. A portion of the insulation layer 236 at which the grounding electrode 234 is placed is open, such that the grounding electrode 234 and the receiving container 300 may be electrically connected to each other through the grounding member 336*b*.

In exemplary embodiments, the opening of the insulation layer 236 is formed on an end portion of the FPC 230, and the grounding member 336*b* is placed at an end portion of the base substrate 232. Advantageously, an opening process of the insulation layer 236 is not required, such that a manufacturing process of an LCD device may be simplified.

The insulation layer 236 is combined with the base substrate 232 of the FPC 230 through the first adhesive member 236*a*, and combined with the bottom plate 310 of the receiving container 300 through the second adhesive member 236*b*. The first and second adhesive members 236*a* and 236*b* may include a gluing agent or a double-sided adhesive tape. In exemplary embodiments, the first and second adhesive members 236*a* and 236*b* may be the same or different types of material. For example, in the illustrated embodiment, the first and second adhesive members 236*a* and 236*b* of FIGS. 12A and 12B are a gluing agent and a double-sided adhesive tape, respectively.

In exemplary embodiments, the grounding member 336*b* and the receiving container 300 may include a conductive material such as metal. Advantageously, an ESD and an EMI generated from the FPC 230 may be rapidly removed to the receiving container 300 through the grounding member 336*b*.

In alternative embodiments, the grounding member 336*b* may include a conductive elastic material such as conductive rubber, so that the grounding member 336*b* may make contact with the grounding electrode 234 more firmly.

A grounding structure of the FPC 230 as illustrated in the above exemplary embodiment may be employed for electrically connecting the FPC 230 to the receiving container 300. The grounding structure of the FPC 230 may also be employed for electrically connecting an FPC 230 to another FPC 230. Alternatively, the grounding structure of the FPC 230 may be employed for electrically connecting an FPC 230 to a PCB.

According to the illustrated embodiments, a grounding member is protruded from a receiving container for a display device to ground an FPC. Alternatively, a grounding member may be protruded from an FPC to ground the FPC.

A display device as in the illustrated embodiments may not include a grounding member including conductive double-sided adhesive tape in order to ground an FPC. Advantageously, manufacturing cost of the display device may be reduced and a grounding structure may be simplified.

As a further advantage, the FPC is regularly and stably grounded, such that grounding characteristics thereof may be improved and an ESD and an EMI generated from an FPC may be rapidly removed through the grounding structure.

Although the exemplary embodiments in the illustrated embodiments have been described, it is understood that the invention should not be limited to these exemplary embodiments but various changes and modifications can be made by one ordinary skilled in the art within the spirit and scope of the invention as hereinafter claimed.

What is claimed is:

1. A backlight assembly, comprising:
   a light source generating light;
   a bottom chassis configured to receive the light source, the bottom chassis being electrically conductive and comprising:
     a bottom plate; and
     a grounding member disposed on the bottom plate, the grounding member integrally formed with the bottom plate;
   a circuit board disposed on the bottom plate; and
   an insulation layer disposed between the circuit board and the bottom plate,
   wherein
   the insulation layer defines an opening exposing the circuit board and a portion of the bottom plate, and
   the grounding member is protruded through the opening to electrically connect the circuit board to the bottom plate.

2. A display device comprising:
   a display panel displaying an image;
   a receiving container receiving the display panel, the receiving container including a bottom plate, and sidewalls extended from the bottom plate to define a receiving space;
   a circuit board providing the display panel with a driving signal, the circuit board including a base substrate, and a grounding member integrally formed with the base substrate, the grounding member being protruded from the base substrate to make contact with the bottom plate; and
   an insulation layer disposed between the circuit board and the bottom plate, the insulation layer configured to electrically insulate the circuit board and the receiving container from each other, the insulation layer defining a space between the circuit board and the bottom plate where the grounding member is disposed.

3. The display device of claim 2, wherein the base substrate is flexible.

4. The display device of claim 2, wherein the circuit board is disposed on a rear surface of the bottom plate of the receiving container.

5. The display device of claim 2, wherein the circuit board further includes a grounding electrode disposed on the base substrate, and the grounding electrode is electrically connected to the grounding member.

6. The display device of claim 2, wherein the grounding member includes a conductive elastic material.

7. The display device of claim 2, wherein the insulation layer defines an opening corresponding to the grounding member.

8. The display device of claim 2, wherein the grounding member is disposed on a peripheral portion of the circuit board.

9. The display device of claim 2, wherein the grounding member and the bottom plate include a conductive material.

10. A liquid crystal display device comprising:
    a backlight unit providing light;
    a liquid crystal display panel displaying an image using the light;
    a receiving container receiving the liquid crystal display panel, the receiving container including a bottom plate, and sidewalls extended from the bottom plate to define a receiving space;

a circuit board providing the liquid crystal display panel with a driving signal, the circuit board including a base substrate, and a grounding member integrally formed with the base substrate, the grounding member being protruded from the base substrate to make contact with the bottom plate; and an insulation layer disposed between the circuit board and the bottom plate, the insulation layer configured to electrically insulate the circuit board and the receiving container from each other, the insulation layer defining a space between the circuit board and the bottom plate where the grounding member is disposed.

\* \* \* \* \*